United States Patent
Chan et al.

(10) Patent No.: US 9,406,795 B2
(45) Date of Patent: Aug. 2, 2016

(54) TRENCH GATE MOSFET

(71) Applicant: UBIQ Semiconductor Corp., Hsinchu County (TW)

(72) Inventors: Chien-Ling Chan, Hsinchu County (TW); Chi-Hsiang Lee, Hsinchu County (TW)

(73) Assignee: UBIQ Semiconductor Corp., Hsinchu County (TW)

( * ) Notice: Subject to any disclaimer, the term of this patent is extended or adjusted under 35 U.S.C. 154(b) by 0 days.

(21) Appl. No.: 14/497,338

(22) Filed: Sep. 26, 2014

(65) Prior Publication Data

US 2015/0008514 A1    Jan. 8, 2015

Related U.S. Application Data

(62) Division of application No. 13/789,684, filed on Mar. 8, 2013, now Pat. No. 9,035,283.

(30) Foreign Application Priority Data

Jul. 13, 2012 (TW) .............................. 101125354 A

(51) Int. Cl.
| | |
|---|---|
| *H01L 29/49* | (2006.01) |
| *H01L 29/78* | (2006.01) |
| *H01L 29/40* | (2006.01) |
| *H01L 29/66* | (2006.01) |
| *H01L 29/417* | (2006.01) |
| *H01L 29/423* | (2006.01) |

(52) U.S. Cl.
CPC .......... *H01L 29/7813* (2013.01); *H01L 29/407* (2013.01); *H01L 29/4916* (2013.01); *H01L 29/66727* (2013.01); *H01L 29/66734* (2013.01); *H01L 29/7827* (2013.01); *H01L 29/41766* (2013.01); *H01L 29/42368* (2013.01)

(58) Field of Classification Search
CPC ............ H01L 29/7813; H01L 29/4916; H01L 29/407
See application file for complete search history.

(56) References Cited

U.S. PATENT DOCUMENTS

| | | | | |
|---|---|---|---|---|
| 5,229,312 | A  * | 7/1993 | Mukherjee et al. ............ | 438/259 |
| 2009/0152624 | A1* | 6/2009 | Hiller et al. .................... | 257/330 |
| 2010/0078718 | A1* | 4/2010 | Blank et al. .................... | 257/331 |
| 2012/0025304 | A1 | 2/2012 | Blank et al. | |

FOREIGN PATENT DOCUMENTS

TW        201005876        2/2010

OTHER PUBLICATIONS

"Office Action of Taiwan Counterpart Application", issued on Nov. 16, 2015, p. 1-p. 7.

* cited by examiner

*Primary Examiner* — Matthew Reames
(74) *Attorney, Agent, or Firm* — Jianq Chyun IP Office

(57) ABSTRACT

A trench gate MOSFET is provided. An epitaxial layer is disposed on a substrate. A body layer is disposed in the epitaxial layer. The epitaxial layer has a first trench therein, the body layer has a second trench therein, and the first trench is disposed below the second trench. A first insulating layer is disposed on a surface of the first trench. A second insulating layer is disposed in the first trench. A first conductive layer is disposed between the first and second insulating layers. A second conductive layer is disposed in the second trench. A third insulating layer is disposed between the second conductive layer and the body layer and between the second conductive layer and the first conductive layer. A dielectric layer is disposed on the epitaxial layer and covers the second conductive layer. Two doped regions are disposed in the body layer respectively beside the second trench.

18 Claims, 14 Drawing Sheets

TRENCH GATE MOSFET

CROSS-REFERENCE TO RELATED APPLICATION

This application is a divisional application of and claims the priority benefit of a prior application Ser. No. 13/789,684, filed on Mar. 8, 2013, now pending. The prior application Ser. No. 13/789,684 claims the priority benefit of Taiwan application serial no. 101125354, filed on Jul. 13, 2012. The entirety of each of the above-mentioned patent applications is hereby incorporated by reference herein and made a part of this specification.

BACKGROUND

1. Field of the Invention

The invention relates to a semiconductor component, and more particularly to a trench gate metal-oxide-semiconductor field effect transistor (MOSFET).

2. Description of Related Art

Trench MOSFET has been widely applied in power switch devices, such as power supplies, rectifiers, low-voltage motor controllers, or so forth. In general, the trench MOSFET is often resorted to a design of vertical structure to enhance the device density. In a power MOSFET, each drain region is formed on the back-side of a chip, and each source region and each gate are formed on the front-side of the chip. The drain regions of the transistors are connected in parallel so as to endure a considerable large current.

A working loss of the trench MOSFET may be divided into a switching loss and a conducting loss, wherein the switching loss caused by the input capacitance $C_{iss}$ is going up as the operation frequency is increased. The input capacitance $C_{iss}$ includes a gate-to-source capacitance $C_{gs}$ and a gate-to-drain capacitance $C_{gd}$.

A conventional practice is to form a gate electrode and a shielded gate electrode inside a trench. The shielded gate electrode is located below the gate electrode, an insulating layer is separated the gate electrode from the shielded gate electrode, and the shielded gate electrode is connected to the source electrode. Although such practice may reduce the gate-to-drain capacitance $C_{gd}$, it increases the gate-to-source capacitance $C_{gs}$ on the other hand, and is unable to effectively lower the switching loss.

SUMMARY OF THE INVENTION

Accordingly, the invention provides a trench gate MOSFET capable of simultaneously reducing the gate-to-drain capacitance $C_{gd}$ and the gate-to-source capacitance $C_{gs}$, so as to effectively lower the switching loss and enhance the device performance.

The invention provides a trench gate MOSFET. An epitaxial layer with a first conductivity type is disposed on a substrate with the first conductivity type. A body layer with a second conductivity type is disposed in the epitaxial layer. The epitaxial layer has a first trench therein, the body layer has a second trench therein, and the first trench is disposed below the second trench. A first insulating layer is disposed on a surface of the first trench. A second insulating layer is disposed in the first trench. A first conductive layer is disposed between the first insulating layer and the second insulating layer. A second conductive layer is disposed in the second trench. A third insulating layer is disposed between the second conductive layer and the body layer and between the second conductive layer and the first conductive layer. A dielectric layer is disposed on the epitaxial layer and covers the second conductive layer. Two doped regions with the first conductivity type are disposed in the body layer respectively beside the second trench.

In an embodiment of the invention, a thickness of the third insulating layer is smaller than a thickness of the first insulating layer.

In an embodiment of the invention, the first conductive layer further extends into the second trench.

In an embodiment of the invention, the third insulating layer further covers a top of the first conductive layer.

In an embodiment of the invention, a material of the first conductive layer includes doped polysilicon.

In an embodiment of the invention, a material of the second conductive layer includes doped polysilicon.

In an embodiment of the invention, the trench gate MOSFET further includes a third conductive layer disposed on the dielectric layer, wherein the third conductive layer is electrically connected to the body layer via two conductor plugs.

In an embodiment of the invention, a material of the third conductive layer includes metal.

In an embodiment of the invention, the first conductivity type is N-type and the second conductivity type is P-type; or the first conductivity type is P-type and the second conductivity type is N-type.

The invention further provides a trench gate MOSFET. An epitaxial layer with a first conductivity type is disposed on a substrate with the first conductivity type. A body layer with a second conductivity type is disposed in the epitaxial layer. The epitaxial layer has a first trench therein, the body layer has a second trench therein, and the first trench is disposed below the second trench. A first conductive layer is disposed in the first trench and having a bowl shape or U-shape. A second conductive layer is disposed in the second trench and electrically insulated from the first conductive layer. A dielectric layer is disposed on the epitaxial layer and covers the second conductive layer. Two doped regions with the first conductivity type are disposed in the body layer respectively beside the second trench.

In an embodiment of the invention, the first conductive layer is electrically insulated from the epitaxial layer.

In an embodiment of the invention, the second conductive layer is electrically insulated from the body layer.

In an embodiment of the invention, the first conductive layer further extends into the second trench.

In an embodiment of the invention, a material of the first conductive layer includes doped polysilicon.

In an embodiment of the invention, a material of the second conductive layer includes doped polysilicon.

In an embodiment of the invention, the trench gate MOSFET further includes a third conductive layer disposed on the dielectric layer, wherein the third conductive layer is electrically connected to the body layer via two conductor plugs.

In an embodiment of the invention, a material of the third conductive layer includes metal.

In an embodiment of the invention, the first conductivity type is N-type and the second conductivity type is P-type; or the first conductivity type is P-type and the second conductivity type is N-type.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

First Embodiment

FIG. 1A to FIG. 1G are cross-sectional diagrams schematically illustrating a manufacturing method for a trench gate MOSFET according to a first embodiment of the present invention.

Figure 1A:
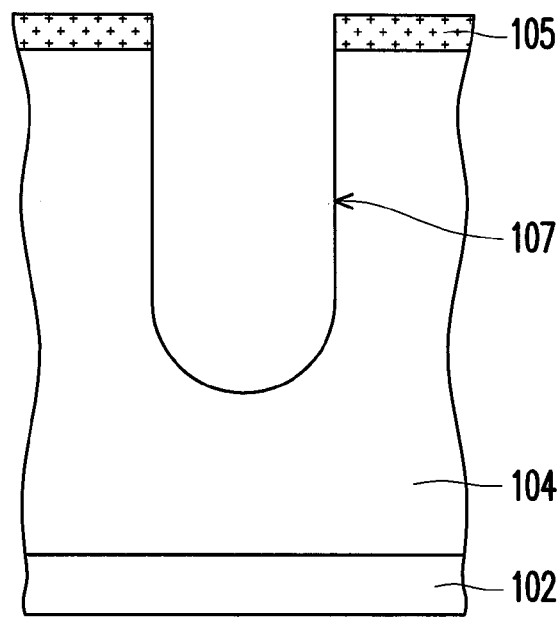
FIG. 1A to FIG. 1G are cross-sectional diagrams schematically illustrating a manufacturing method for a trench gate MOSFET according to a first embodiment of the present invention.

Firstly, referring to FIG. 1A, an epitaxial layer 104 with a first conductivity type and a mask layer 105 are sequentially formed on a substrate 102 with the first conductivity type. The substrate 102 is, for example, an N-type heavily doped silicon substrate. The epitaxial layer 104 is, for example, an N-type lightly doped epitaxial layer, and a forming method thereof includes performing a selective epitaxy growth process (SEG). A material of the mask layer 105 is, for example, silicon nitride, and a forming method thereof includes performing a chemical vapor deposition (CVD) process. Next, an etching process is performed by using the mask layer 105 as a mask, so as to form a trench 107 in the epitaxial layer 104. Then, the mask layer 105 is removed.

Figure 1B:
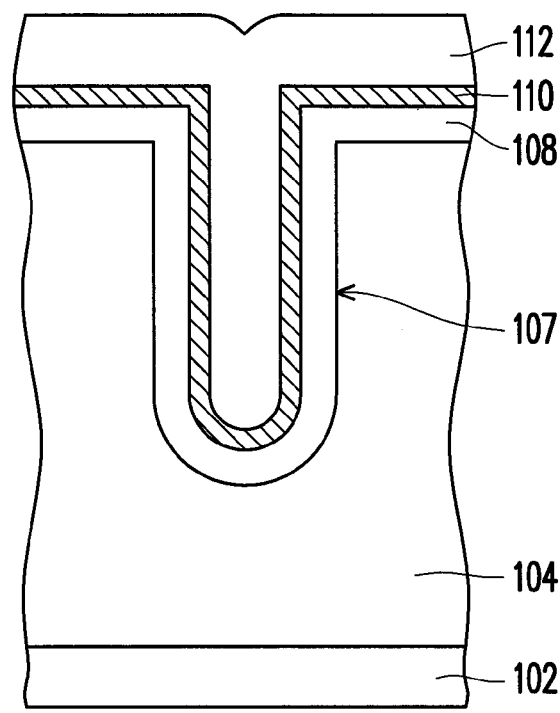

Referring to FIG. 1B, an insulating layer 108 and a conductive layer 110 are conformally formed on surfaces of the epitaxial layer 104 and the trench 107. A material of the insulating layer 108 is, for example, silicon oxide, and a forming method thereof includes performing a thermal oxidation or a chemical vapor deposition process. A material of the conductive layer 110 is, for example, doped polysilicon, and a forming method thereof includes performing a chemical vapor deposition process. Then, an insulating material layer 112 is formed on the conductive layer 110, and the insulating material layer 112 fills up the trench 107. A material of the insulating material layer 112 is, for example, tetraethosiloxane (TEOS) silicon oxide, and a forming method thereof includes performing a chemical vapor deposition process.

Figure 1C:
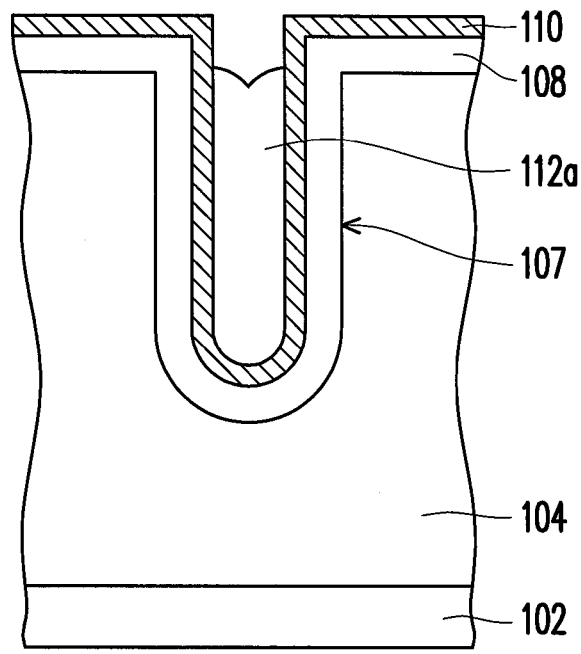

Referring to FIG. 1C, an etching back process is performed to remove a portion of the insulating material layer 112, so as to form an insulating layer 112a filling up the trench 107. In an embodiment, the etching back process exposes the top surface of the conductive layer 110, and the thickness of the insulating layer 112a may be controlled with the time mode.

Figure 1D:
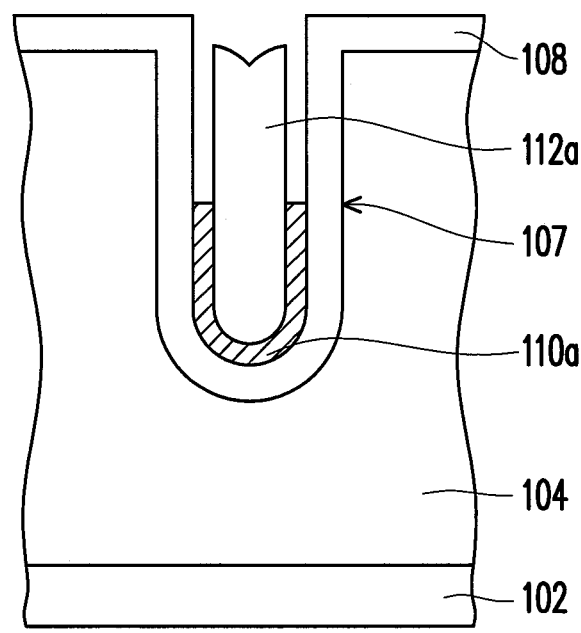

Referring to FIG. 1D, a portion of the conductive layer 110 is removed to form a conductive layer 110a, which exposes an upper portion of the insulating layer 112a and the top surface and a portion of the sidewall of the insulating layer 108. Specifically, the conductive layer 110a is appeared as bowl-shaped or U-shaped, disposed to surround a lower portion of the insulating layer 112a, and located between the insulating layer 112a and the insulating layer 108. A method of forming the conductive layer 110a is, for example, an etching back process, and the height of the top surface of the conductive layer 110a may be controlled with the time mode. In an embodiment, the conductive layer 110a exposes the insulating layer 108, and the height thereof has to be in compliance with the body layer (figure not shown, relative descriptions are to be provided later) or the depth of the trench 107. In this case, the height of the conductive layer 110a is about ½ height of the insulating layer 112a.

Figure 1E:
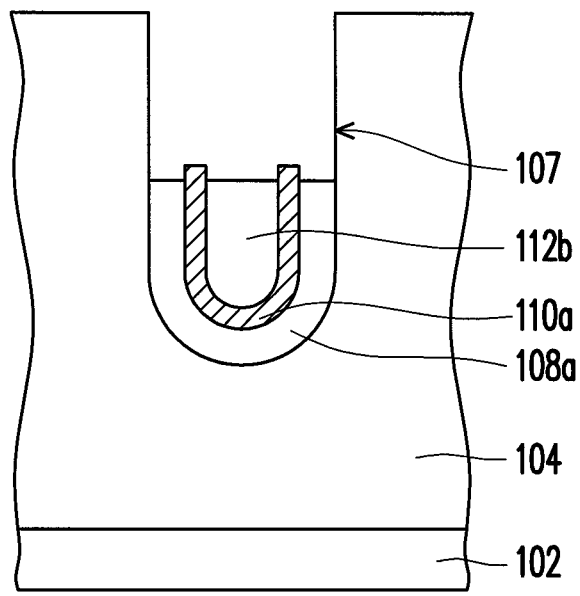

Referring to FIG. 1E, a portion of the insulating layer 112a and a portion of the insulating layer 108 are removed, so that the remaining insulating layer 112b and the remaining insulating layer 108a expose the upper portion of the conductive layer 110a. Specifically, the conductive layer 110a is protruded from the insulating layer 112b and the insulating layer 108a, the conductive layer 110a is disposed to surround the insulating layer 112b, and the insulating layer 108a is disposed to surround the conductive layer 110a. A method of forming the insulating layer 112b and the insulating layer 108a is, for example, an etching back process, and heights of the top surfaces of the insulating layer 112b and the insulating layer 108a may be controlled with the time mode. In an embodiment, the insulating layer 112b and the insulating layer 108a expose about ⅛ to ¹/₁₀ of the height of the conductive layer 110a. Nevertheless, the invention is not limited thereto. In another embodiment, the top surfaces of the insulating layer 112b and the insulating layer 108a may also be substantially planar with the top surface of the conductive layer 110a.

Figure 1F:
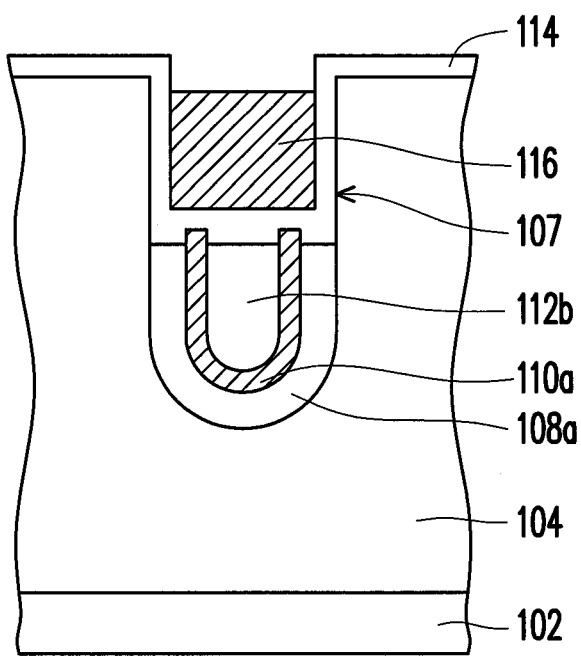

Referring to FIG. 1F, an insulating layer 114 is formed on the surfaces of epitaxial layer 104 and the trench 107, and the insulating layer 114 covers the conductive layer 110a. A material of the insulating layer 114 is, for example, silicon oxide, and a forming method therefore includes performing a thermal oxidation or a chemical vapor deposition process. In an embodiment, the thickness of the insulating layer 114 is smaller than the thickness of the insulating layer 108a. Nevertheless, the invention is not limited thereto. In another embodiment, the thickness of the insulating layer 114 may be greater than or equal to the thickness of the insulating layer 108a. Next, the conductive layer 116 fills up the trench 107. A method of forming the conductive layer 116 includes forming a conductive material layer (not shown) on the epitaxial layer 104, and the conductive material layer fills up the trench 107. A material of the conductive material layer is, for example, doped polysilicon, and a forming method thereof includes performing a chemical vapor deposition process. Then, an etching back process is performed to remove a portion of the conductive material layer.

Figure 1G:
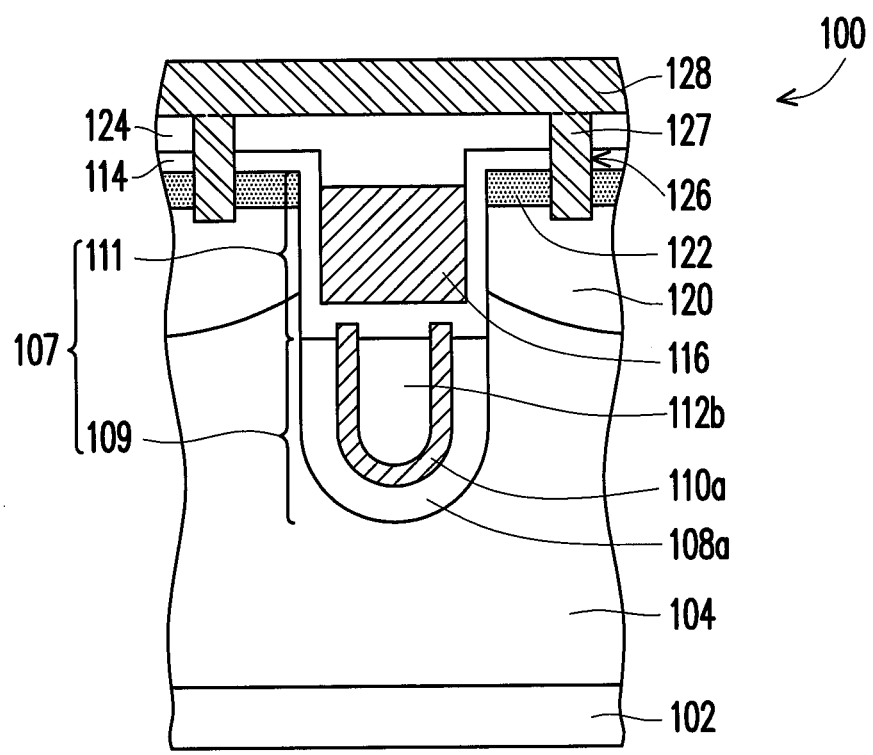

Referring to FIG. 1G, two body layers 120 with a second conductivity type are formed in the epitaxial layer 104 respectively beside the trench 107. The body layers 120 are, for example, P-type body layers, and a forming method thereof includes performing an ion implantation process. Then, two doped regions 122 with the first conductivity type are formed in the body layers 120 respectively beside the trench 107. The doped regions 122 are, for example, N-type heavily doped regions, and a forming method thereof includes performing an ion implantation process.

A dielectric layer 124 is formed on the conductive layer 116 and the doped region 122. A material of the dielectric layer 124 is, for example, silicon oxide, borophosphosilicate glass (BPSG), phosphosilicate (PSG), fluorine silicate glass (FSG) or undoped silicate glass (USG), and a forming method thereof includes performing a chemical vapor deposition process. Next, two openings 126 penetrating the dielectric layer 124 and the doped region 122 are formed. A method of forming the openings 126 includes performing lithographic and etching processes. Then, a conductive layer 128 is formed on the dielectric layer 124, wherein the conductive layer 128 fills in the openings 126 to be electrically connected to the body layers 120. The conductive layer 128 filling in each opening 126 is considered a conductor plug 127. In other word, the conductive layer 128 is electrically connected to the body layers 120 via the conductor plugs 127. A material of the conductive layer 128 may be metal such as aluminum, and a forming method thereof includes performing a chemical vapor deposition process. At this point, the manufacturing of the trench gate MOSFET 100 according to the first embodiment is completed.

The following refers to FIG. 1G for describing the structure of the trench gate MOSFET 100 in the invention. Referring to FIG. 1G, the trench gate MOSFET 100 includes an N-type substrate 102, an N-type epitaxial layer 104, and P-type body layers 120. The epitaxial layer 104 is disposed on the substrate 102. The body layers 120 are disposed in the epitaxial layer 104. In addition, the epitaxial layer 104 has a trench 109 therein, the body layers 120 have a trench 111 therein, and the trench 109 is disposed below the trench 111. The trench 109 and the trench 111 form a trench 107.

The trench gate MOSFET 100 further includes an insulating layer 108a, a conductive layer 110a, an insulating layer 112b, a conductive layer 116, and an insulating layer 114. The insulating layer 108a is disposed at a surface of the trench 109, the insulating layer 112b is disposed in the trench 109, and the conductive layer 110a is disposed between the insulating layer 108a and the insulating layer 112b. The conductive layer 116 is disposed in the trench 111. The insulating layer 114 is disposed between the conductive layer 116 and each body layer 120 and between the conductive layer 116 and the conductive layer 110a. In an embodiment, the conductive layer 110a is further extended into the trench 111, and the insulating layer 114 covers the top of the conductive layer 110a.

The trench gate MOSFET 100 further includes two N-type doped regions 122, a dielectric layer 124, two conductor plugs 127, and a conductive layer 128. The doped regions 122 are disposed in the body layers 120 beside the trench 111. The dielectric layer 124 is disposed on the conductive layer 116 and the doped regions 122. The conductive layer 128 is disposed on the dielectric layer 124, wherein the conductive layer 128 is electrically connected to the body layers 120 via the conductor plugs 127.

In the trench gate MOSFET 100 according to the first embodiment, the substrate 102 is used as a drain electrode, the doped regions 122 are used as source electrodes, the conductive layer 116 is used as a gate electrode, the conductive layer 110a is used as a shielded gate electrode, and the insulating layer 114 is used as a gate oxide layer. Noteworthily, with the disposition of the shielded gate electrode (viz. conductive layer 110a), the gate-to-drain capacitance $C_{gd}$ may be reduced and the breakdown voltage of a transistor may be enhanced. In addition, since the insulating layer 112b is disposed in the shielded gate electrode (viz. conductive layer 110a) to reduce the coupling effect between the gate electrode (viz. conductive layer 116) and the shielded gate electrode (viz. conductive layer 110a), the gate-to-source capacitance $C_{gs}$ may be lowered. Namely, the structure of the invention according to the first embodiment may reduce the gate-to-drain capacitance $C_{gd}$ and the gate-to-source capacitance $C_{gs}$, so that the switching loss may be effectively lowered and the device performance may be enhanced.

Second Embodiment

FIG. 2A to FIG. 2F are cross-sectional diagrams schematically illustrating a manufacturing method for a trench gate MOSFET according to a second embodiment of the present invention.

Figure 2A:
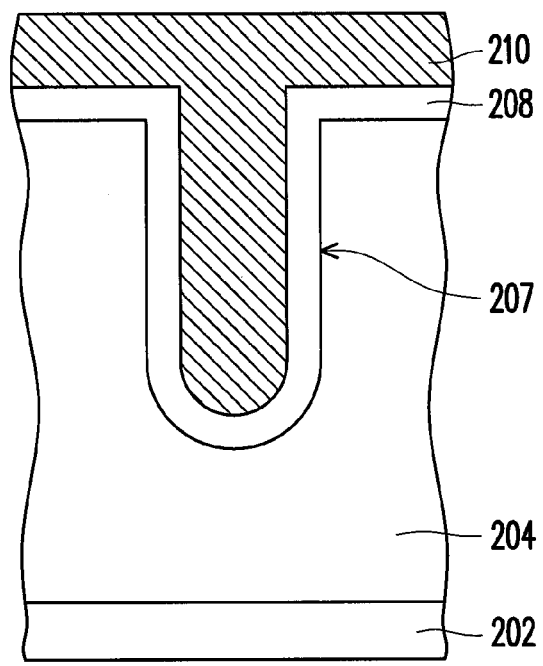
FIG. 2A to FIG. 2F are cross-sectional diagrams schematically illustrating a manufacturing method for a trench gate MOSFET according to a second embodiment of the present invention.

Firstly, referring to FIG. 2A, an epitaxial layer 204 with a first conductivity type is formed on a substrate 202 with the first conductivity type. The substrate 202 is, for example, an N-type silicon substrate. The epitaxial layer 204 is, for example, an N-type epitaxial layer. Then, a trench 207 is formed in the epitaxial layer 204. A method of forming the epitaxial layer 204 and the trench 207 may be referred to the first embodiment, and thus is not repeated herein.

Next, an insulating layer 208 is conformally formed on surfaces of the epitaxial layer 204 and the trench 207. A material of the insulating layer 208 is, for example, silicon oxide, and a forming method thereof includes performing a thermal oxidation or a chemical vapor deposition process. Then, a conductive material layer 210 is formed on the insulating layer 208, and the conductive material layer 210 fills up the trench 207. A material of the conductive material layer 210 is, for example, doped polysilicon, and a forming method thereof includes performing a chemical vapor deposition process.

Figure 2B:
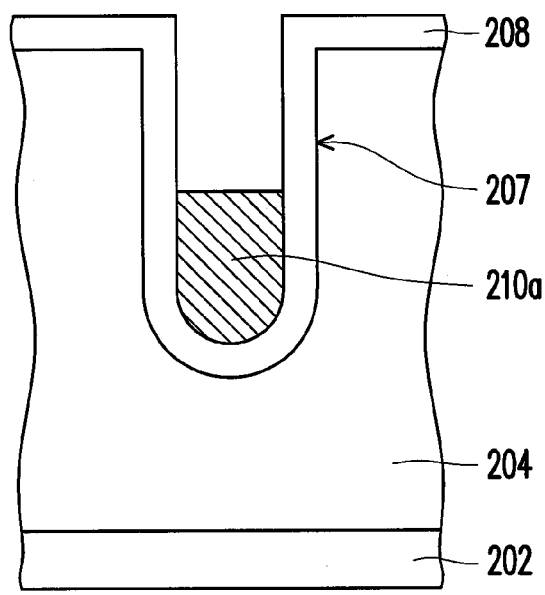

Afterward, referring to FIG. 2B, an etching back process is performed to remove a portion of the conductive material layer 210, so as to form a conductive layer 210a at a bottom of the trench 207. In an embodiment, the etching back process exposes the top surface and a portion of the sidewall of the insulating layer 208, and the height of the top surface of the conductive layer 210a may be controlled with a time mode. In an embodiment, the height of the top surface of the conductive layer 210a has to be in compliance with the depth of the body layer, such as about ½ depth of the trench.

Figure 2C:
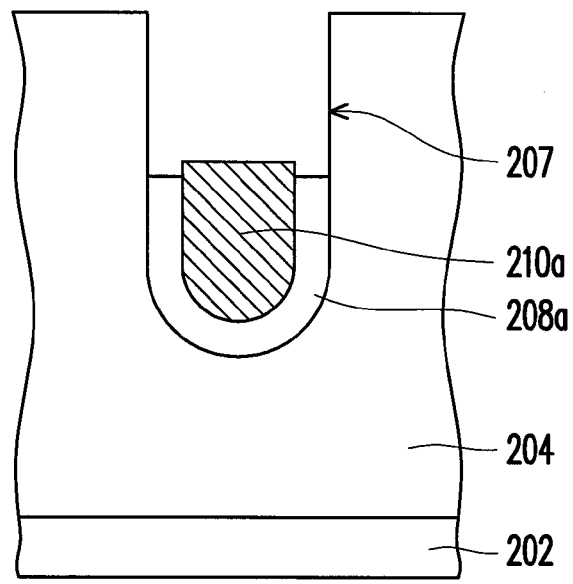

Subsequently, referring to FIG. 2C, a portion of the insulating layer 208 is removed to form an insulating layer 208a exposing an upper portion of the conductive layer 210a. A method of forming the insulating layer 208a includes performing an etching back process, till about ⅛ to 1/10 of the height of the conductive layer 210a is exposed. In an embodiment, the height exposed by the conductive layer 210a may be controlled with a time mode. Nevertheless, the invention is not limited thereto. In another embodiment, the top surface of the insulating layer 208a may be substantially planar with the top surface of the conductive layer 210a.

Figure 2D:
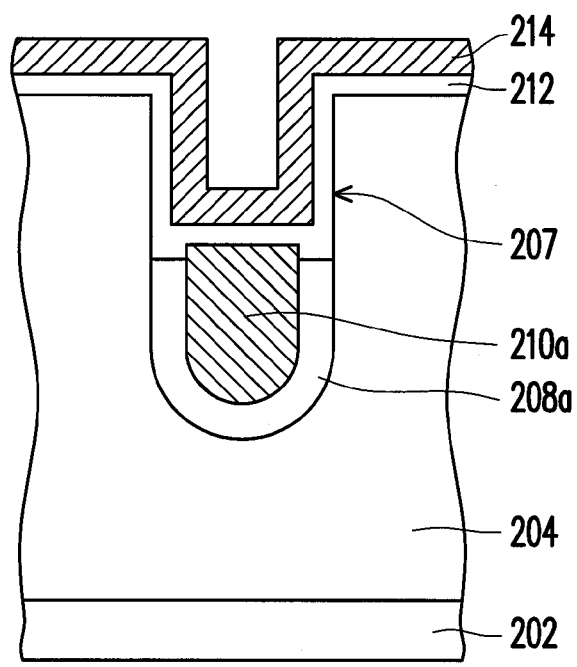

Next, referring to FIG. 2D, an insulating layer 212 is conformally formed on surfaces of the epitaxial layer 204 and the trench 207, and the insulating layer 212 covers the conductive layer 210a. A material of the insulating layer 212 is, for example, silicon oxide, and a forming method thereof includes performing a thermal oxidation or a chemical vapor deposition process. In an embodiment, the thickness of the insulating layer 212 is smaller than the thickness of the insulating layer 208a. Nevertheless, the invention is not limited thereto. In another embodiment, the thickness of the insulating layer 212 may also be greater than or equal to the thickness of the insulating layer 208a. Then, a conductive layer 214 is conformally formed on the insulating layer 212. A material of the conductive layer 214 is, for example, doped polysilicon, and a forming method thereof includes performing a chemical vapor deposition process.

Figure 2E:
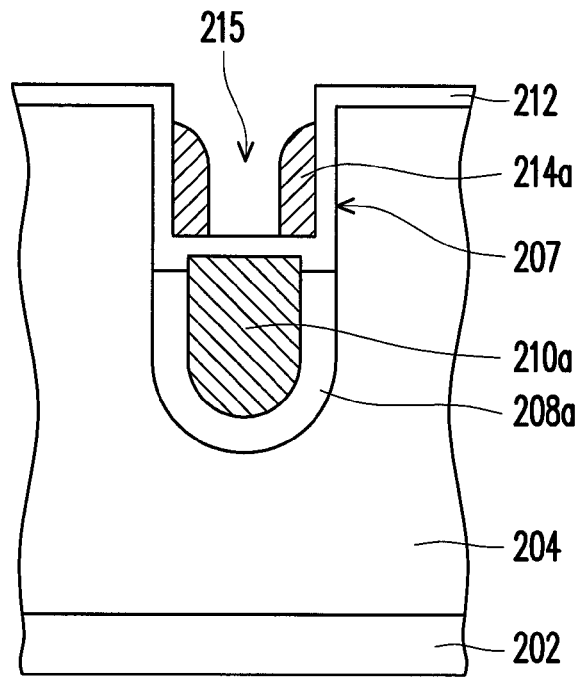

Then, referring to FIG. 2E, a portion of the conductive layer 214 is removed to form a conductive layer 214a on a sidewall of the insulating layer 212. Specifically, the conductive layer 214a is disposed on the sidewall of the insulating layer 212 in the form of a spacer, and has an opening 215 exposing a portion of the bottom surface of the insulating layer 212. A method of forming the conductive layer 214a includes performing an anisotropic dry etching process.

Subsequently, referring to FIG. 2F, two body layers 220 with a second conductivity type are formed in the epitaxial layer 204 respectively beside the trench 207. The body layers 220 are, for example, P-type body layers. Afterward, two doped regions 222 with the first conductivity type are formed in the body layers 220 respectively beside the trench 207. The doped regions 222 are, for example, N-type heavily doped regions. Then, a dielectric layer 224 is formed on the conductive layer 214a and the doped region 222, and the dielectric layer 224 fills in the opening 215. Subsequently, two openings 226 which penetrate the dielectric layer 224 and the doped regions 222 are formed. Next, a conductive layer 228 is formed on the dielectric layer 224, wherein the conductive layer 228 fills in the openings 226 to be electrically connected to the body layers 220. The conductive layer 228 filling in each opening 226 is considered a conductor plug 227. In other words, the conductive layer 228 is electrically connected to the body layers 120 via the conductor plugs 227. Materials and forming methods of the body layers 220, the doped regions 222, the conductor plugs 227, and the conductive layer 228 may be referred to the first embodiment, and thus are not repeated herein. At this point, the manufacturing of the trench gate MOSFET 200 according to the second embodiment is completed.

Figure 2F:
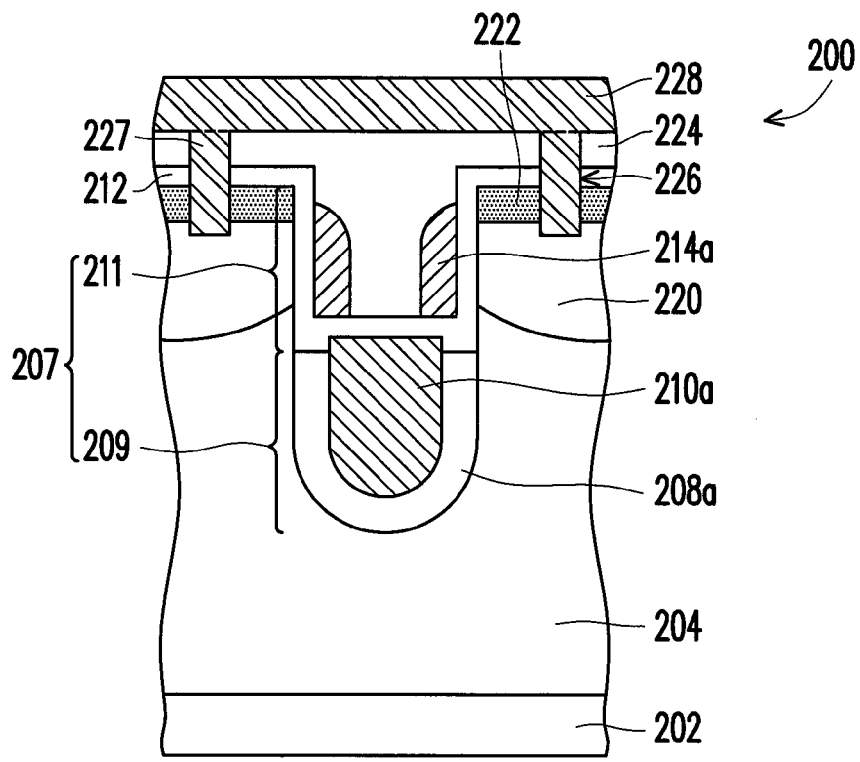

The following refers to FIG. 2F for describing the structure of the trench gate MOSFET 200 in the invention. Referring to FIG. 2F, the trench gate MOSFET 200 includes an N-type substrate 202, an N-type epitaxial layer 204, P-type body layers 220. The epitaxial layer 204 is disposed on the substrate 202. The body layers 220 are disposed in the epitaxial layer 204. In addition, the epitaxial layer 204 has a trench 209 therein, the body layers 220 have a trench 211 therein, and the trench 209 is disposed below the trench 211. The trench 209 and the trench 211 form a trench 207.

The trench gate MOSFET 200 further includes an insulating layer 208a, a conductive layer 210a, an insulating layer 212, and a conductive layer 214a. The conductive layer 210a is disposed in the trench 209. The insulating layer 208a is disposed between the conductive layer 210a and the epitaxial layer 204. The conductive layer 214a is disposed on a sidewall of the trench 211. The insulating layer 212 is disposed between the conductive layer 214a and each body layer 220 and between the conductive layer 214a and the conductive layer 210a. In an embodiment, the conductive layer 210a is further extended into the trench 211, and the insulating layer 212 covers the top of the conductive layer 210a.

The trench gate MOSFET 200 further includes two N-type doped regions 222, a dielectric layer 224, two conductor plugs 227, and a conductive layer 228. The doped regions 222 are disposed in the body layers 220 beside the trench 211. The dielectric layer 224 is disposed on the insulating layer 212 and fills up the trench 211. Namely, the dielectric layer 224 is disposed in the opening 215 of the conductive layer 214a. The conductive layer 228 is disposed on the dielectric layer 224, wherein the conductive layer 228 is electrically connected to the body layers 220 via the conductor plugs 227.

In the trench gate MOSFET 200 according to the second embodiment, the substrate 202 is used as a drain electrode, the doped regions 222 are used as source electrodes, the conductive layer 214a is used as a gate electrode, the conductive layer 210a is used as a shielded gate electrode, and the insulating layer 212 is used as a gate oxide layer. Noteworthily, with the disposition of the shielded gate electrode (viz. conductive layer 210a), the gate-to-drain capacitance $C_{gd}$ may be reduced and the breakdown voltage of a transistor may be enhanced. In addition, since the dielectric layer 224 is disposed in the gate electrode (viz. conductive layer 214a) to reduce the coupling effect between the gate electrode (viz. conductive layer 214a) and the shielded gate electrode (viz. conductive layer 1210a), the gate-to-source capacitance $C_{gs}$ may be lowered. Namely, the structure of the invention according to the second embodiment may simultaneously reduce the gate-to-drain capacitance $C_{gd}$ and the gate-to-source capacitance $C_{gs}$, so that the switching loss may be effectively lowered and the device performance may be enhanced.

Third Embodiment

FIG. 3A to FIG. 3H are cross-sectional diagrams schematically illustrating a manufacturing method for a trench gate MOSFET according to a third embodiment of the present invention.

Figure 3A:
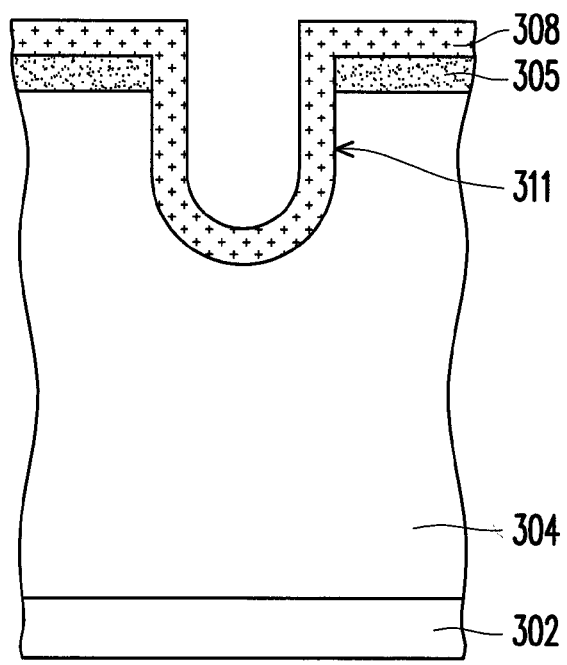
FIG. 3A to FIG. 3H are cross-sectional diagrams schematically illustrating a manufacturing method for a trench gate MOSFET according to a third embodiment of the present invention.

Firstly, referring to FIG. 3A, an epitaxial layer 304 with a first conductivity type and a mask layer 305 are sequentially formed on a substrate 302 with the first conductivity type. The substrate 302 is, for example, an N-type silicon substrate. The epitaxial layer 304 is, for example, an N-type epitaxial layer. A material of the mask layer 305 is, for example, silicon oxide, silicon nitride or silicon oxynitride, and a forming method thereof includes performing a chemical vapor deposition process. Next, an etching process is performed by using the mask layer 305 as a mask, so that a trench 311 is formed in the epitaxial layer 304. Then, a spacer material layer 308 is formed on surfaces of the epitaxial layer 304 and the trench 311. A material of the spacer material layer 308 is, for example, silicon oxide, silicon nitride or silicon oxynitride, and a forming method thereof includes performing a chemical vapor deposition process. In the present embodiment, the material of the mask layer 305 is different from that of the spacer material layer 308.

Figure 3B:
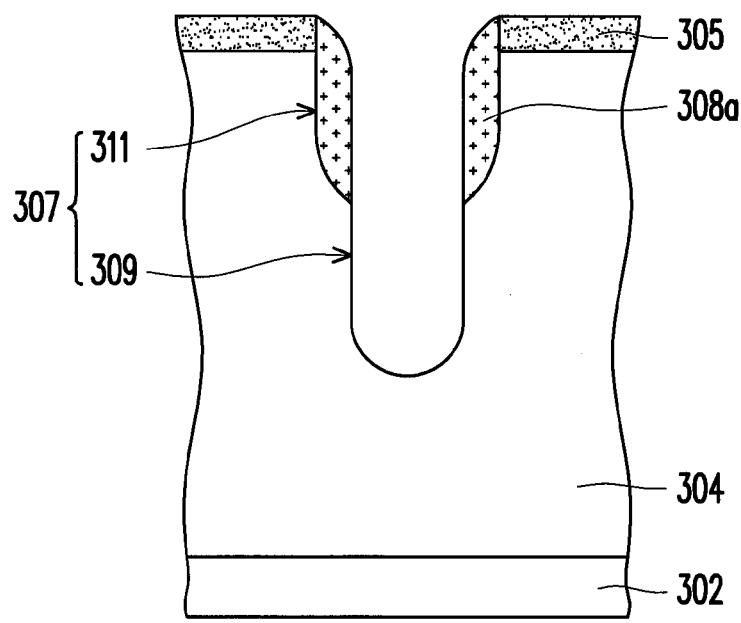

Afterward, referring to FIG. 3B, an anisotropic dry etching process is performed to remove a portion of the spacer material layer 308, so as to form a spacer 308a on a sidewall of the trench 311. In the present embodiment, since the etching selectivity of the spacer material layer 308 to the mask layer 305 is high enough, the anisotropic dry etching process is substantially stopped on a surface of the mask layer 305. In other words, the mask layer 305 can protect the surface of the epitaxial layer 304 from being damaged by the subsequent etching processes. Then, a portion of the epitaxial layer 304 is removed by using the mask layer 305 and the spacer 308a as a mask, so as to form a trench 309 below the trench 311. A method of forming the trench 309 is, for example, performing an etching process. Then, the spacer 308a is removed. Since the method of forming the trench 309 is to use the spacer 308a as the mask, it is a self-aligned process, wherein the width of the trench 309 is smaller than the width of the trench 311. In addition, the trench 309 is disposed below the trench 311, and the trench 309 and the trench 311 form a trench 307.

Figure 3C:
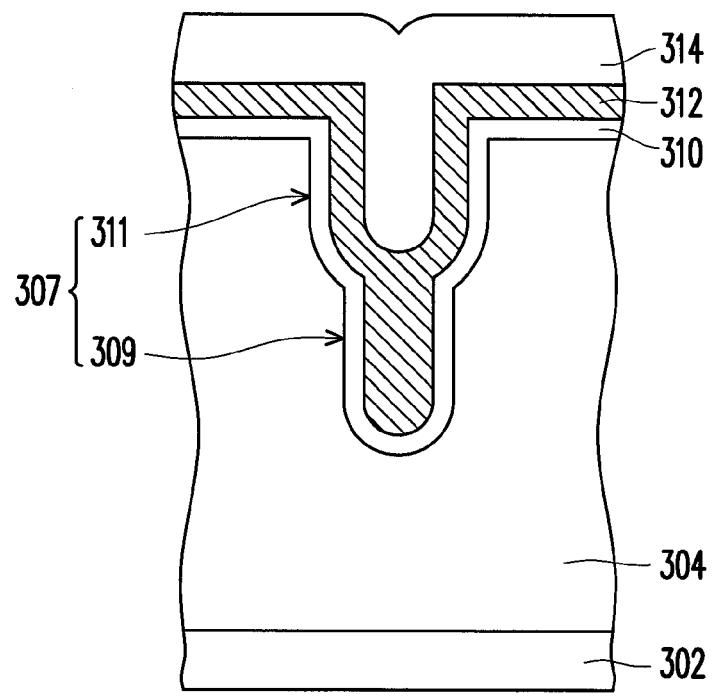

Subsequently, referring to FIG. 3C, an insulating layer 310 is conformally formed on surfaces of the epitaxial layer 304 and the trench 307. A material of the insulating layer 310 is, for example, silicon oxide, and a forming method thereof includes performing a thermal oxidation or a chemical vapor deposition process. Next, a conductive layer 312 is formed on the insulating layer 310. Specifically, the conductive layer 312 is conformally formed on the surfaces of the epitaxial layer 304 and the trench 311 and fills up the trench 309. A material of the conductive layer 312 is, for example, doped polysilicon, and a forming method thereof includes performing a chemical vapor deposition process. Then, an insulating material layer 314 is formed on the epitaxial layer 304 and fills up the trench 311. A material of the insulating material layer 314 is, for example, silicon oxide, and a forming method thereof includes performing a chemical vapor deposition process.

Figure 3D:
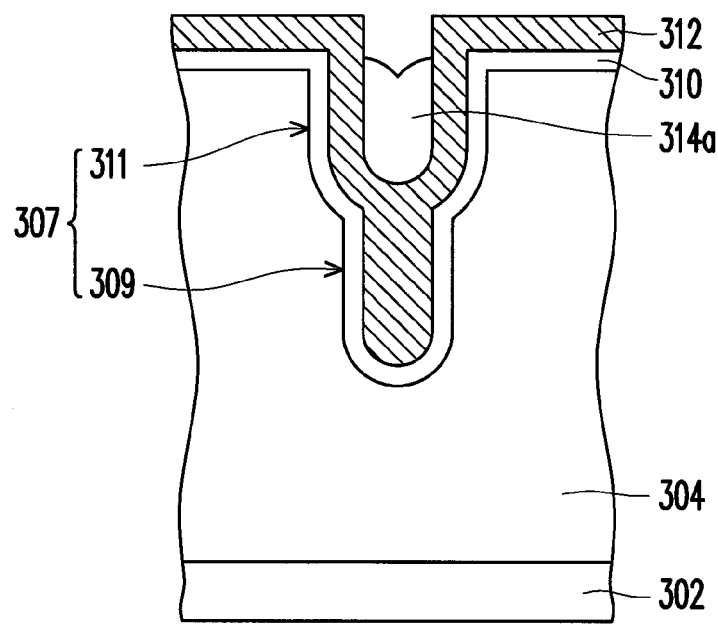

Then, referring to FIG. 3D, an etching back process is performed to remove a portion of the insulating material layer 314, so as to form an insulating layer 314a filling up the trench 311. In an embodiment, the etching back process exposes the top surface of the conductive layer 312, and the thickness of the insulating layer 314a may be controlled with a time mode. In an embodiment, the width of the insulating layer 314a is substantially equal to the width of the conductive layer 312 in the trench 309, as shown in FIG. 3D. Nevertheless, the invention is not limited thereto. In another embodiment, the width of insulating layer 314a may also be greater than the width of the conductive layer 312 in the trench 309.

Figure 3E:
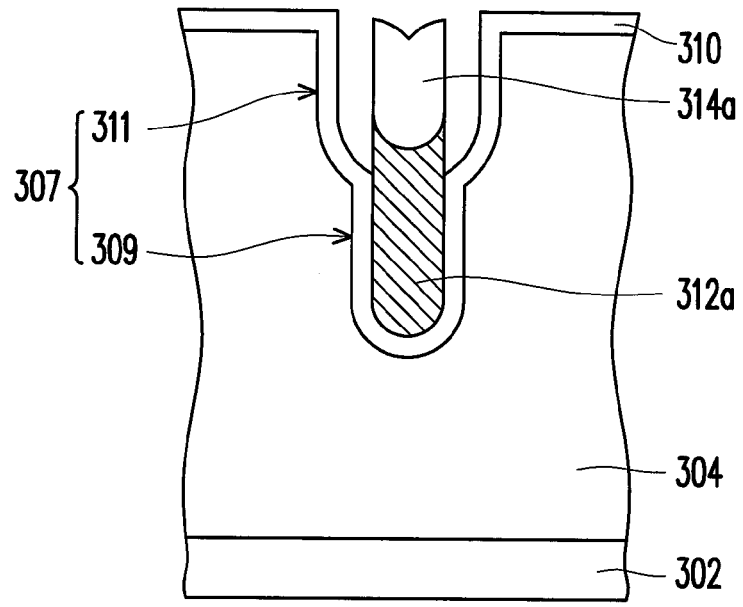

Next, referring to FIG. 3E, a portion of the conductive layer 312 is removed to form a conductive layer 312a below the insulating layer 314a. A method of forming the conductive layer 312a includes performing an anisotropic dry etching process by using the insulating layer 314a as a mask. In addition, since the forming method is to use the insulating layer 314a as the mask, it is a self-aligned process, wherein the conductive layer 312a is located right below the insulating layer 314a. In addition, since the width of the insulating layer 314a is greater than or equal to the width of the conductive layer 312 in the trench 309, the etching process does not remove the conductive layer 312 in the trench 309.

Figure 3F:
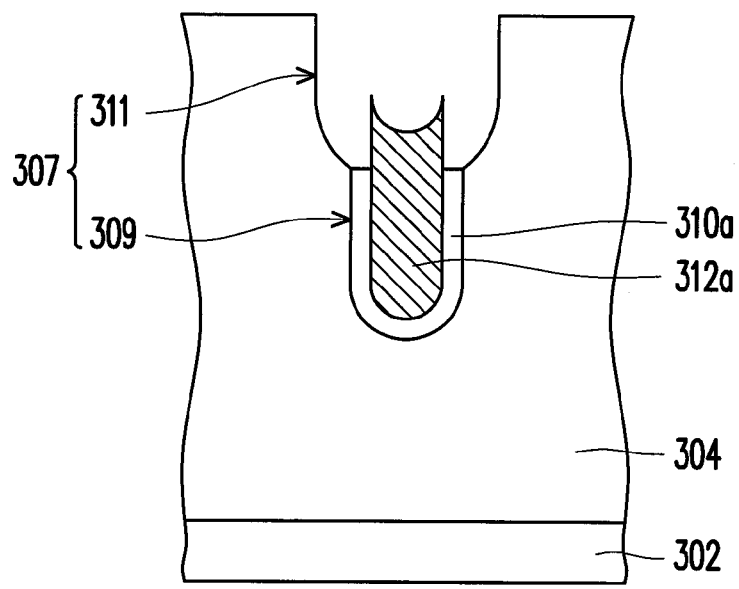

Then, referring to FIG. 3F, the insulating layer 314a and a portion of the insulating layer 310 are removed, so as to form an insulating layer 310 exposing an upper portion of the conductive layer 312a. A method of forming the insulating layer 310a is, for example, an etching back process, and the height of the top surface of the insulating layer 310a may be controlled with a time mode. In an embodiment, the insulating layer 310a exposes about 1/8 to 1/10 of the height of the conductive layer 312a. In another embodiment, the insulating layer 310a is only located on the surface of the trench 309.

Figure 3G:
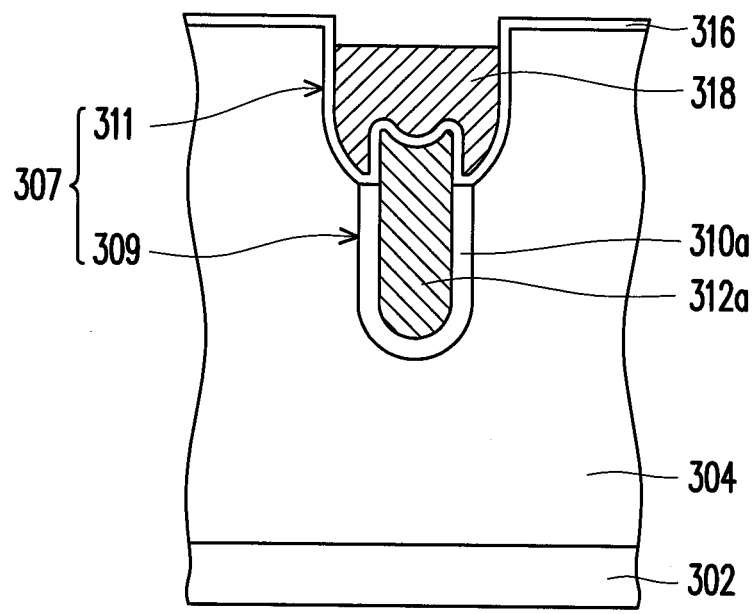

Next, referring to FIG. 3G, an insulating layer 316 is conformally formed on the surfaces of the epitaxial layer 304 and the trench 307, and the insulating layer 316 covers the conductive layer 312a. A material of the insulating layer 316 is, for example, silicon oxide, and a forming method thereof includes performing a thermal oxidation or a chemical vapor deposition process. In an embodiment, the thickness of the insulating layer 316 is smaller than the thickness of the insulating layer 310a. Nevertheless, the invention is not limited thereto. In another embodiment, the thickness of the insulating layer 316 may also be greater than or equal to the thickness of the insulating layer 310a. Next, the conductive layer 318 fills up the trench 311. A method of forming the conductive layer 318 includes forming a conductive material layer (not shown) on the epitaxial layer 304, and the conductive material layer fills up the trench 311. A material of the conductive material layer is, for example, doped polysilicon, and a forming method thereof includes performing a chemical vapor deposition process. Then, an etching back process is performed to remove a portion of the conductive material layer.

Subsequently, referring to FIG. 3H, two body layers 320 with a second conductivity type are formed in the epitaxial layer 304 respectively beside the trench 311. The body layers 320 are, for example, P-type body layers. Afterward, two doped regions 322 with the first conductivity type are formed in the body layers 320 respectively beside the trench 311. The doped regions 322 are, for example, N-type heavily doped regions. Then, a dielectric layer 324 is formed on the conductive layer 318 and the doped regions 322. Subsequently, two openings 326 which penetrate the dielectric layer 324 and the doped regions 322 are formed. Next, a conductive layer 328 is formed on the dielectric layer 324, wherein the conductive layer 328 fills in the openings 326 to be electrically connected to the body layers 320. The conductive layer 328 filling in each opening 326 is considered a conductor plug 327. In other words, the conductive layer 328 is electrically connected to the body layers 320 via the conductor plugs 327. Materials and forming methods of the body layers 320, the doped regions 322, the conductor plugs 327, and the conductive layer 328 may be referred to the first embodiment, and thus are not repeated herein. At this point, the manufacturing of the trench gate MOSFET 300 according to the third embodiment is completed.

Figure 3H:
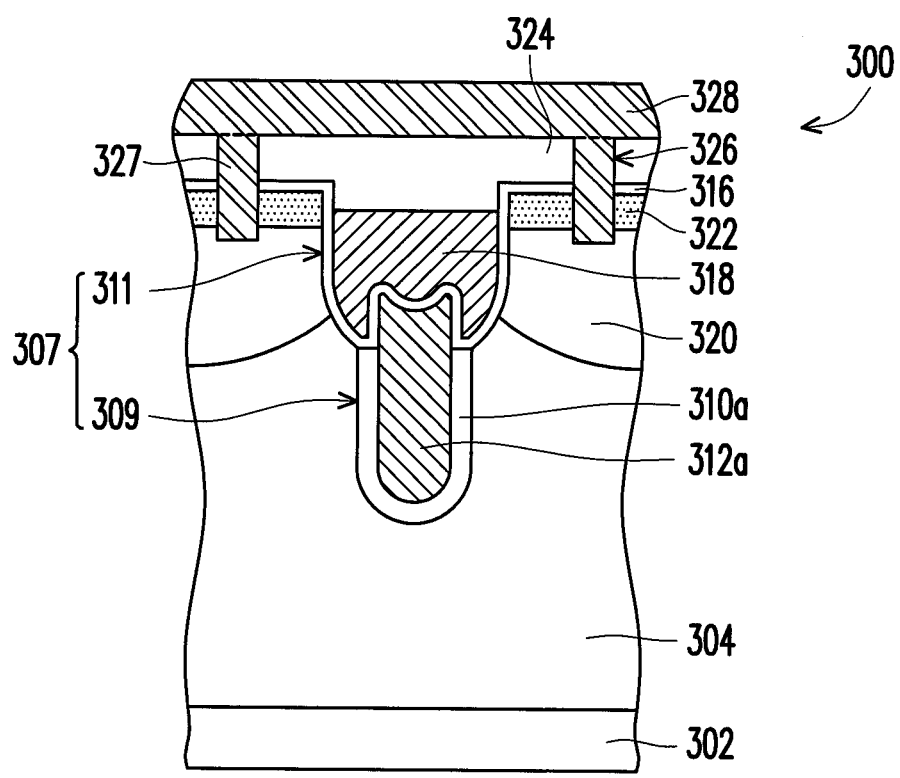

The following refers to FIG. 3H for describing the structure of the trench gate MOSFET 300. Referring to FIG. 3H, the trench gate MOSFET 300 includes an N-type substrate 302, an N-type epitaxial layer 304, and P-type body layers 320. The epitaxial layer 304 is disposed on the substrate 302. The body layers 320 are disposed in the epitaxial layer 304. In addition, the epitaxial layer 304 has a trench 309 therein, the body layers 320 have a trench 311 therein, and the trench 309 is disposed below the trench 311. The trench 309 and the trench 311 form a trench 307.

The trench gate MOSFET 300 further includes an insulating layer 310a, a conductive layer 312a, an insulating layer 316, and a conductive layer 318. The insulating layer 310a is disposed on the surface of the trench 309. The conductive layer 312a fills up the trench 309. The conductive layer 318 is disposed in the trench 311. The insulating layer 316 is disposed between the conductive layer 318 and each body layer 320 and between the conductive layer 318 and the conductive layer 312a. In an embodiment, the conductive layer 312a is further extended into the trench 311, and the insulating layer 316 covers the top of the conductive layer 312a.

The trench gate MOSFET 300 further includes two N-type doped regions 322, a dielectric layer 324, two conductor plugs 327, and a conductive layer 328. The doped regions 322 are disposed in the body layers 320 beside the trench 311. The dielectric layer 324 is disposed on the conductive layer 318 and the doped regions 322. The conductive layer 328 is disposed on the dielectric layer 324, wherein the conductive layer 328 is electrically connected to the body layers 320 via the conductor plugs 327.

In the trench gate MOSFET 300 according to the third embodiment, the substrate 302 is used as a drain electrode, the doped regions 322 are used as source electrodes, the conductive layer 318 is used as a gate electrode, the conductive layer 312a is used as a shielded gate electrode, and the insulating layer 316 is used as a gate oxide layer. Noteworthily, with the disposition of the shielded gate electrode (viz. conductive layer 312a), the gate-to-drain capacitance $C_{gd}$ may be reduced and the breakdown voltage of a transistor may be enhanced. In addition, since the width of the trench 309 is smaller than the width of the trench 311 and the thickness of the insulating layer 310a is greater than the thickness of the insulating layer 316, the width of the shielded gate electrode (viz. conductive layer 312a) is smaller than the width of the gate electrode (viz. conductive layer 318). Therefore, the coupling effect between the gate electrode (viz. conductive layer 318) and the shielded gate electrode (viz. conductive layer 312a) may be reduced, and thus the gate-to-source capacitance $C_{gs}$ may be lowered. Namely, the structure of the invention may simultaneously reduce the gate-to-drain capacitance $C_{gd}$ and the gate-to-source capacitance $C_{gs}$, so that the switching loss may be effectively lowered and the device performance may be enhanced.

Fourth Embodiment

FIG. 4A to FIG. 4F are cross-sectional diagrams schematically illustrating a manufacturing method for a trench gate MOSFET according to a fourth embodiment of the present invention.

Figure 4A:
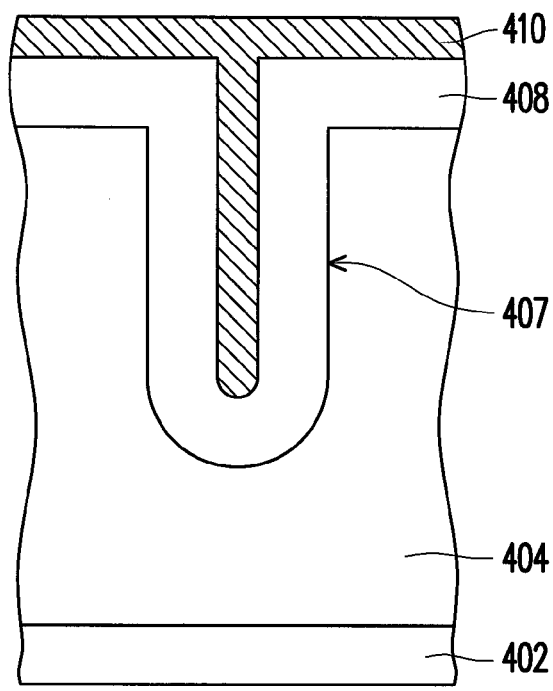
FIG. 4A to FIG. 4F are cross-sectional diagrams schematically illustrating a manufacturing method for a trench gate MOSFET according to a fourth embodiment of the present invention.

Firstly, referring to FIG. 4A, an epitaxial layer 404 with a first conductivity type is formed on a substrate 402 with the first conductivity type. The substrate 402 is, for example, an N-type silicon substrate. The epitaxial layer 404 is, for example, an N-type epitaxial layer. Then, a trench 407 is formed in the epitaxial layer 404. Methods for forming the epitaxial layer 404 and the trench 407 may be referred to the first embodiment, and thus are not repeated herein.

Next, an insulating layer 408 is conformally formed on surfaces of the epitaxial layer 404 and the trench 407. A material of the insulating layer 408 is, for example, silicon oxide, and a forming method thereof includes performing a thermal oxidation or a chemical vapor deposition process. Then, a conductive material layer 410 is formed on the epitaxial layer 404 and fills up the trench 407. A material of the conductive material layer 410 is, for example, doped polysilicon, and a forming method thereof includes performing a chemical vapor deposition process.

Figure 4B:
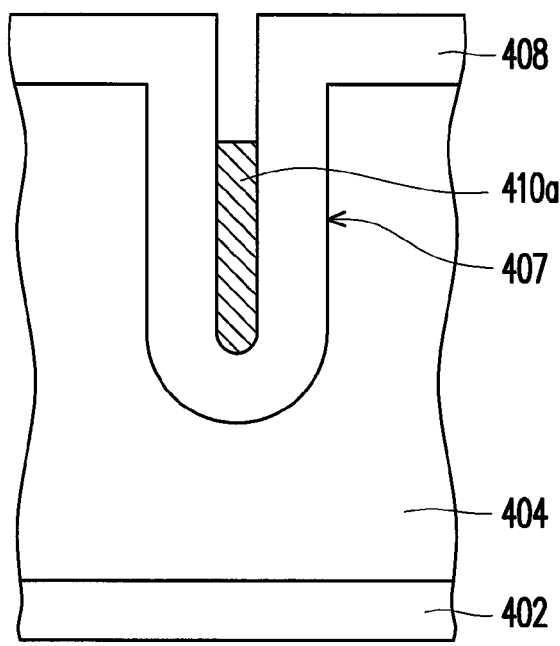

Afterward, referring to FIG. 4B, an etching back process is performed to remove a portion of the conductive material layer 410, so as to form a conductive layer 410a in the trench 407. In an embodiment, the etching back process exposes the top surface and a portion of the sidewall of the insulating layer 408, and the thickness of the conductive layer 410a may be controlled with a time mode.

Figure 4C:
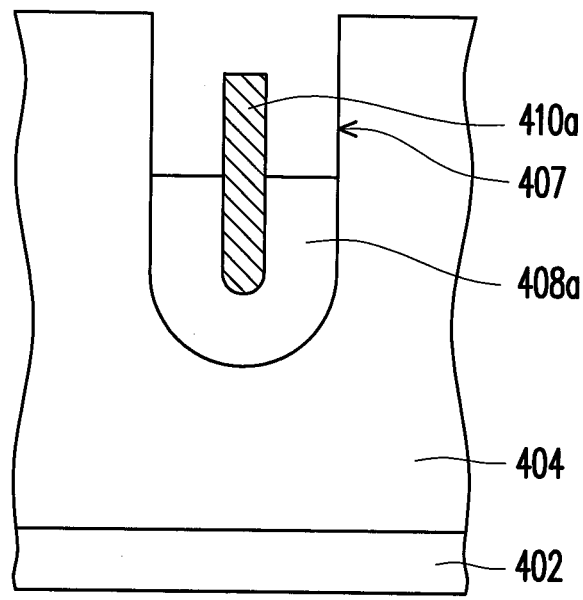

Subsequently, referring to FIG. 4C, a portion of the insulating layer 408 is removed, so as to form an insulating layer 408a exposing an upper portion of the conductive layer 410a. A method of forming the insulating layer 408a includes performing an etching back process, till about ⅓ to ⅖ of the height of the conductive layer 410a is exposed. In an embodiment, the height exposed by the conductive layer 410a may be controlled by a time mode. In an embodiment, the height of the top surface of the insulating layer 408a has to be in compliance with the depth of the body layer, and in this case, it is about ½ depth of the trench 407.

Figure 4D:
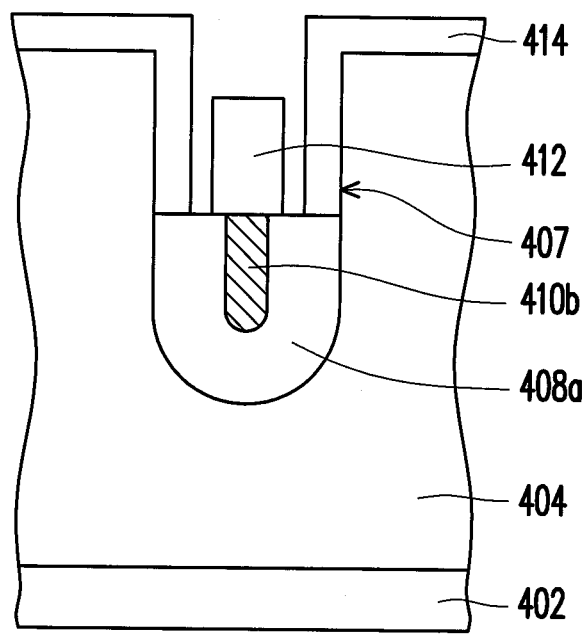

The following refers to FIG. 4D for performing an oxidation process. The upper portion of the conductive layer 410a which is not covered by the insulating layer 408a is oxidized to become an insulating layer 412, while a conductive layer 410b is retained. An insulating layer 414 is simultaneously formed on the surface of the epitaxial layer 404 and the sidewall of the trench 407 by the same oxidation process. A material of the insulating layer 412 and the insulating layer 414 is, for example, silicon oxide. In an embodiment, the upper portion of the conductive layer 410a is completely oxidized by the oxidation process, as shown in FIG. 4D. In another embodiment (not shown), the upper portion of the conductive layer 410a is only partially oxidized by the oxidation process. In addition, in an embodiment, the thickness of the insulating layer 414 is smaller than the thickness of the insulating layer 408a. Nevertheless, the invention is not limited thereto. In another embodiment, the thickness of the insulating layer 414 may be greater than or equal to the thickness of the insulating layer 408a.

Figure 4E:
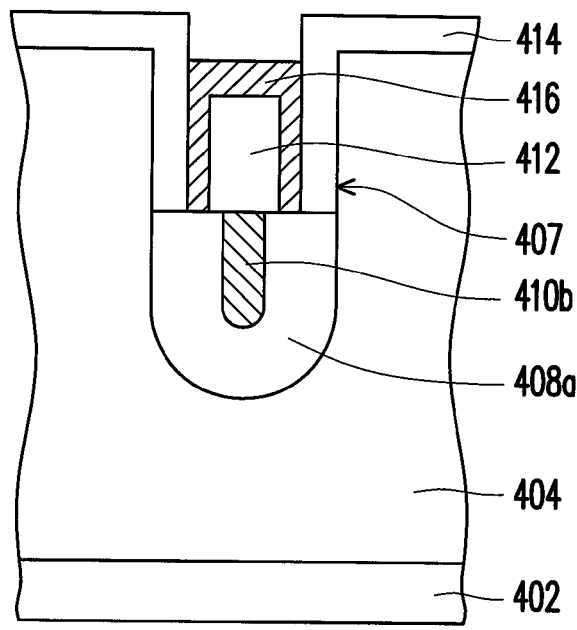

Then, referring to FIG. 4E, a conductive layer 416 is formed in the trench 407. A method of forming the conductive layer 416 includes forming a conductive material layer (not shown) on the epitaxial layer 404, and the conductive material layer covers the insulating layer 412 and the insulating layer 414, and fills up the trench 407. A material of the conductive material layer is, for example, doped polysilicon, and a forming method thereof includes performing a chemical vapor deposition process. Afterward, an etching back process is performed, and a portion of the conductive material layer is removed.

Figure 4F:
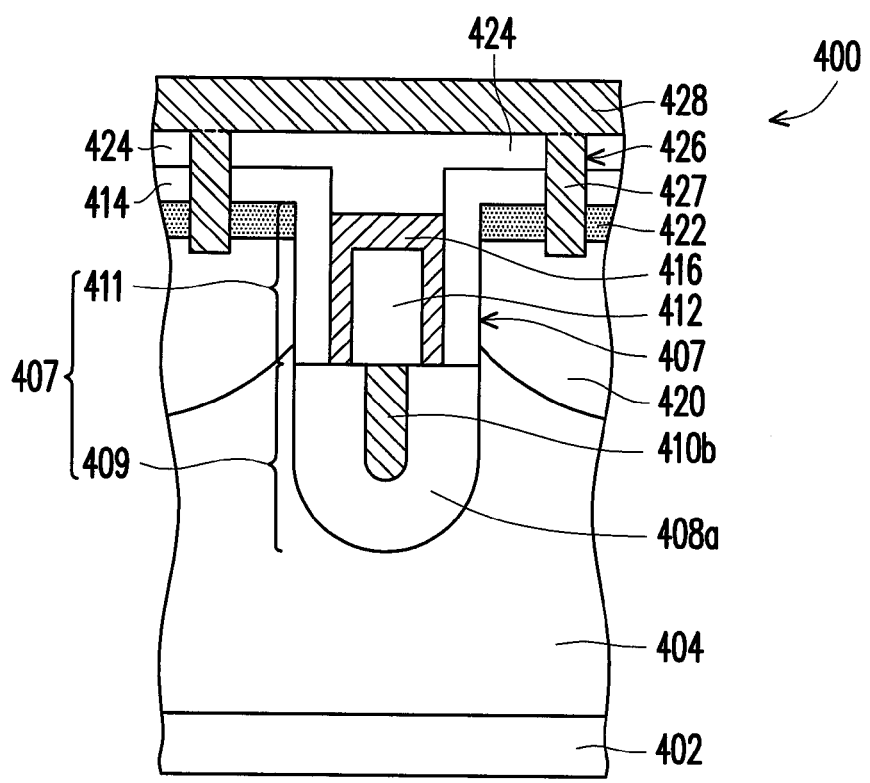

Next, referring to FIG. 4F, two body layers 420 with a second conductivity type are formed in the epitaxial layer 404 respectively beside the trench 407. The body layers 420 are, for example, P-type body layers. Afterward, two doped regions 422 with the first conductivity type are formed in the body layers 420 respectively beside the trench 407. The doped regions 422 are, for example, N-type heavily doped regions. Then, a dielectric layer 424 is formed on the conductive layer 416 and the doped regions 422. Subsequently, two openings 426 which penetrate the dielectric layer 424 and the doped regions 422 are formed. Next, a conductive layer 428 is formed on the dielectric layer 424, wherein the conductive layer 428 fills in the openings 426 to be electrically connected to the body layers 420. The conductive layer 428 filling in each opening 426 is considered a conductor plug 427. In other words, the conductive layer 428 is electrically connected to the body layers 420 via the conductor plugs 427. Materials and forming methods of the body layers 420, the doped regions 422, the conductor plugs 427, and the conductive layer 428 may be referred to the first embodiment, and thus are not repeated herein. At this point, the manufacturing of the trench gate MOSFET 400 according to the fourth embodiment is completed.

The following refers to FIG. 4F for describing the structure of the trench gate MOSFET 400 in the invention. Referring to FIG. 4F, the trench gate MOSFET 400 includes an N-type substrate 402, an N-type epitaxial layer 404, and P-type body layers 420. The epitaxial layer 204 is disposed on the substrate 402. The body layers 420 are disposed in the epitaxial layer 404. In addition, the epitaxial layer 404 has a trench 409 therein, the body layers 420 have a trench 411 therein, and the trench 409 is disposed below the trench 411. The trench 409 and the trench 411 form a trench 407.

The trench gate MOSFET 400 further includes an insulating layer 408a, a conductive layer 410b, an insulating layer 412, an insulating layer 414, and a conductive layer 416. The conductive layer 410b is disposed in the trench 409. The insulating layer 408a is disposed between the conductive layer 410b and the epitaxial layer 404. The insulating layer 412 is disposed in the trench 411 and covers the conductive layer 410b. Namely, the width of the insulating layer 412 is greater than or equal to the width of the conductive layer 410b. In addition, the conductive layer 416 is disposed in the trench 411 and covers the insulating layer 412. The insulating layer 414 is disposed between the conductive layer 416 and each body layer 420.

The trench gate MOSFET 400 further includes two N-type doped regions 422, a dielectric layer 424, two conductor plugs 427, and a conductive layer 428. The doped regions 422 are disposed in the body layers 420 beside the trench 411. The dielectric layer 424 is disposed on the epitaxial layer 404 and covers the conductive layer 416. The conductive layer 428 is disposed on the dielectric layer 424, wherein the conductive layer 428 is electrically connected to the body layers 420 via the conductor plugs 427.

In the trench gate MOSFET 400 according to the fourth embodiment, the substrate 402 is used as a drain electrode, the doped regions 422 are used as source electrodes, the conductive layer 416 is used as a gate electrode, the conductive layer 410b is used as a shielded gate electrode, and the insulating layer 414 is used as a gate oxide layer. Noteworthily, with the disposition of the shielded gate electrode (viz. conductive layer 410b), the gate-to-drain capacitance $C_{gd}$ may be reduced and the breakdown voltage of a transistor may be enhanced. In addition, since the dielectric layer 412 is disposed in the gate electrode (viz. conductive layer 416) to reduce the coupling effect between the gate electrode (viz. conductive layer 416) and the shielded gate electrode (viz. conductive layer 410b), the gate-to-source capacitance $C_{gs}$ may be lowered. Namely, the structure of the invention may simultaneously reduce the gate-to-drain capacitance $C_{gd}$ and the gate-to-source capacitance $C_{gs}$, so that the switching loss may be effectively lowered and the device performance may be enhanced.

Moreover, in the first to the fourth embodiments, the first conductivity type is considered as N-type and the second conductivity type is considered as P-type for the purpose of the description, but the invention is not limited thereto. One of the ordinary skill in the art would understand that the first conductivity type may also be considered as P-type and the second conductivity type may also be considered as N-type.

In summary, in the trench gate MOSFET of the invention, by disposing a shielded gate electrode below a gate electrode, the gate-to-drain capacitance $C_{gd}$ may be reduced and the breakdown voltage of a transistor may be enhanced. In addition, by disposing an insulating layer (or a dielectric layer) in the gate electrode or the shielded gate electrode may reduce the coupling effect between the gate electrode and the shielded gate electrode, thus lowering the gate-to-source capacitance $C_{gs}$. Alternatively, by manufacturing a trench with wide top and narrow bottom, the coupling effect between the gate electrode at the top trench and the shielded gate electrode at the bottom trench is able to be reduced, and the gate-to-source capacitance $C_{gs}$ may also be lowered. In other words, the structure of the invention may simultaneously reduce the gate-to-drain capacitance $C_{gd}$ and the gate-to-source capacitance $C_{gs}$, so that the switching loss may be effectively lowered and the device performance may be enhanced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A trench gate MOSFET, comprising:
   a substrate with a first conductivity type;
   an epitaxial layer with the first conductivity type disposed on the substrate;
   a body layer with a second conductivity type disposed in the epitaxial layer, wherein the epitaxial layer has a first trench therein, the body layer has a second trench therein, and the first trench is disposed below the second trench;
   a first insulating layer disposed on a surface of the first trench;
   a first conductive layer disposed in the first trench and having a bowl shape or U-shape;
   a second insulating layer disposed in the first trench and being completely separated from the first insulating layer by the bowl-shaped or U-shaped first conductive layer;
   a second conductive layer disposed in the second trench;
   a third insulating layer disposed between the second conductive layer and the body layer, and between the second conductive layer and the first conductive layer;
   a dielectric layer disposed on the epitaxial layer and directly covering the second conductive layer; and
   two doped regions with the first conductivity type disposed in the body layer respectively beside the second trench.

2. The trench gate MOSFET as recited in claim 1, wherein a thickness of the third insulating layer is smaller than a thickness of the first insulating layer.

3. The trench gate MOSFET as recited in claim 1, wherein the first conductive layer further extends into the second trench.

4. The trench gate MOSFET as recited in claim 3, wherein the third insulating layer further covers a top of the first conductive layer.

5. The trench gate MOSFET as recited in claim 1, wherein a material of the first conductive layer comprises doped polysilicon.

6. The trench gate MOSFET as recited in claim 1, wherein a material of the second conductive layer comprises doped polysilicon.

7. The trench gate MOSFET as recited claim 1, further comprising a third conductive layer disposed on the dielectric layer, wherein the third conductive layer is electrically connected to the body layer via two conductor plugs.

8. The trench gate MOSFET as recited in claim 7, wherein a material of the third conductive layer comprises metal.

9. The trench gate MOSFET as recited in claim 1, wherein the first conductivity type is N-type and the second conductivity type is P-type; or the first conductivity type is P-type and the second conductivity type is N-type.

10. A trench gate MOSFET, comprising:
    a substrate with a first conductivity type;
    an epitaxial layer with the first conductivity type disposed on the substrate;
    a body layer with a second conductivity type disposed in the epitaxial layer, wherein the epitaxial layer has a first trench therein, the body layer has a second trench therein, and the first trench is disposed below the second trench;
    a first conductive layer disposed in the first trench and having a bowl shape or U-shape;
    a second conductive layer disposed in the second trench and electrically insulated from the first conductive layer;
    a dielectric layer disposed on the epitaxial layer and directly contacting the second conductive layer; and
    two doped regions with the first conductivity type disposed in the body layer respectively beside the second trench, wherein the dielectric layer does not contact the two doped regions.

11. The trench gate MOSFET as recited in claim 10, wherein the first conductive layer is electrically insulated from the epitaxial layer.

12. The trench gate MOSFET as recited in claim 10, wherein the second conductive layer is electrically insulated from the body layer.

13. The trench gate MOSFET as recited in claim 10, wherein the first conductive layer further extends into the second trench.

14. The trench gate MOSFET as recited in claim 10, wherein a material of the first conductive layer comprises doped polysilicon.

15. The trench gate MOSFET as recited in claim 10, wherein a material of the second conductive layer comprises doped polysilicon.

16. The trench gate MOSFET as recited claim 10, further comprising a third conductive layer disposed on the dielectric layer, wherein the third conductive layer is electrically connected to the body layer via two conductor plugs.

17. The trench gate MOSFET as recited in claim 16, wherein a material of the third conductive layer comprises metal.

18. The trench gate MOSFET as recited in claim 10, wherein the first conductivity type is N-type and the second conductivity type is P-type; or the first conductivity type is P-type and the second conductivity type is N-type.

* * * * *